(12) United States Patent
Hou

(10) Patent No.: US 11,011,705 B2
(45) Date of Patent: May 18, 2021

(54) PIXEL DEFINING LAYER, DISPLAY PANEL, FABRICATING METHOD THEREOF, AND DISPLAY DEVICE

(71) Applicant: BOE Technology Group Co., Ltd., Beijing (CN)

(72) Inventor: Wenjun Hou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 95 days.

(21) Appl. No.: 16/220,445

(22) Filed: Dec. 14, 2018

(65) Prior Publication Data

US 2019/0305221 A1 Oct. 3, 2019

(30) Foreign Application Priority Data

Mar. 30, 2018 (CN) .......................... 201810286623.8

(51) Int. Cl.
*H01L 27/32* (2006.01)
*H01L 51/00* (2006.01)
*H01L 51/56* (2006.01)

(52) U.S. Cl.
CPC ...... *H01L 51/0005* (2013.01); *H01L 27/3223* (2013.01); *H01L 51/56* (2013.01)

(58) Field of Classification Search
CPC .................................................. H01L 27/3223
See application file for complete search history.

(56) References Cited

U.S. PATENT DOCUMENTS

| | | | |
|---|---|---|---|
| 2002/0064966 A1* | 5/2002 | Seki | H01L 27/3223 438/780 |
| 2005/0184980 A1* | 8/2005 | Sato | G09G 3/3648 345/204 |
| 2018/0144675 A1* | 5/2018 | Lee | G09G 3/2003 |
| 2018/0308413 A1* | 10/2018 | Jin | G09G 3/3607 |

* cited by examiner

*Primary Examiner* — Lex H Malsawma
*Assistant Examiner* — Geoffrey H Ida
(74) *Attorney, Agent, or Firm* — Myers Bigel, P.A.

(57) ABSTRACT

A pixel defining layer is disclosed including a display area and a non-display area located at a periphery of the display area, wherein the display area includes pixel units, and the non-display area includes dummy pixel units arranged outside one or more corners of the display area. A display panel, a display device, a method of fabricating a pixel defining layer, and a method of fabricating the display panel are also disclosed.

13 Claims, 3 Drawing Sheets

US 11,011,705 B2

PIXEL DEFINING LAYER, DISPLAY PANEL, FABRICATING METHOD THEREOF, AND DISPLAY DEVICE

CROSS REFERENCE TO RELATED APPLICATIONS

This U.S. non-provisional patent application claims priority under 35 U.S.C. § 119 to Chinese Patent Application No. 201810286623.8, filed Mar. 30, 2018, the entire disclosure of which is incorporated herein by reference.

TECHNICAL FIELD

The present disclosure relates to the field of display technology, in particular to a pixel defining layer, a display panel, a display device, a method of fabricating a pixel defining layer and a method of fabricating a display panel.

BACKGROUND

An organic electroluminescent display device (OLED) has the advantages of self-luminescence, fast response, wide viewing angle, high brightness, lurid colors, light weight and thin thickness, etc., and is considered to be the development trend of the next generation display technology. Films in the electroluminescent display device are usually prepared by a vacuum evaporation process and a solution process. The solution process comprises spinning, inkjet printing, nozzle applying, etc. Inkjet printing is widely used in the fabrication of electroluminescent display devices due to the advantage of its high material utilization, etc. However, the thickness uniformity of organic functional layers formed by inkjet printing still needs to be improved.

SUMMARY

Embodiments of the present disclosure provide a pixel defining layer, comprising a display area and a non-display area located at a periphery of the display area, wherein the display area comprises pixel units, and the non-display area comprises dummy pixel units arranged outside one or more corners of the display area.

According to an exemplary embodiment, corners of the display area are rounded, and the dummy pixel units in the non-display area and the pixel units in the display area form a rectangular pattern.

According to an exemplary embodiment, the plurality of dummy pixel units are arranged in a delta shape.

According to an exemplary embodiment, m*(m+1)/2 dummy pixel units are arranged outside each corner of the display area, where m is a natural number greater than or equal to 2.

According to an exemplary embodiment, three dummy pixel units are arranged outside each corner of the display area.

According to an exemplary embodiment, corners of the display area are right angled.

According to an exemplary embodiment, the plurality of dummy pixel units are arranged in an L shape.

According to an exemplary embodiment, 2n+1 dummy pixel units are arranged outside each corner of the display area, where n is a natural number greater than or equal to 2.

According to an exemplary embodiment, five pixel units are arranged outside each corner of the display area.

According to an exemplary embodiment, the non-display area further comprises dummy pixel units arranged outside one or more sides of the display area.

Embodiments of the present disclosure further provide a display device comprising the display panel as described above.

Embodiments of the present disclosure further provide a method of fabricating a pixel defining layer. The method comprises: applying a pixel defining material on a substrate; forming pixel units in a display area of the substrate, and forming dummy pixel units in a non-display area of the substrate, wherein the dummy pixel units are arranged outside one or more corners of the display area.

Embodiments of the present disclosure further provide a method of fabricating a display panel. The method comprises: forming the pixel defining layer as described above, and inkjet printing an organic material in the pixel defining layer to form an organic functional layer.

BRIEF DESCRIPTION OF THE DRAWINGS

In order to more clearly illustrate the technical solutions in the embodiments of the present disclosure, the drawings needed to be used in the description of the embodiments will be introduced briefly in the following. Obviously, the drawings in the following description are only some embodiments of the disclosure.

DETAILED DESCRIPTION

Figure 1A:
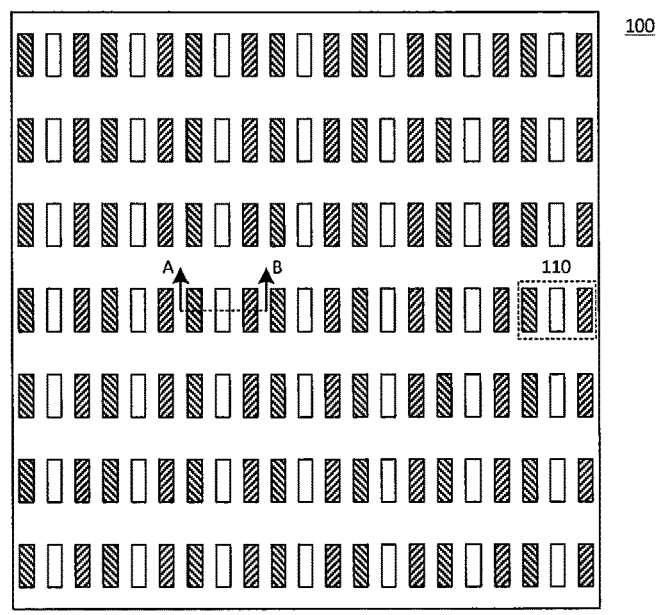
FIG. 1A and FIG. 1B are schematic diagrams of a pixel defining layer.

In order to make the objects, technical solutions and advantages of the embodiments of the present disclosure more clear, the technical solutions of the embodiments of the present disclosure will be further described in detail below in conjunction with the drawings.

List of reference numerals: 100, 200, 300, 400, 500—pixel defining layer; 101—substrate; 102—pixel aperture; 103—organic functional layer; 110, 210, 310—pixel unit; 200A, 300A, 400A, 500A—display area; 200D, 300D, 400D, 400D', 500D, 500D'—non-display area; 220, 320, 420, 520—dummy pixel unit; 500C—corner of display area.

Figure 1B:
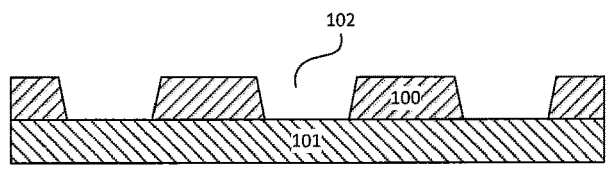

FIG. 1A shows a plan view of a pixel defining layer 100, and FIG. 1B shows a cross-sectional view taken along line AB in FIG. 1A. In inkjet printing, it is often desirable to form a pixel defining layer comprising pixel apertures on a substrate, such that an ink is accurately printed to designated pixel apertures. As shown, the pixel defining layer 100 is usually arranged on a substrate 101 and comprises a plurality of pixel apertures 102. Various organic functional layers are formed by inkjet printing organic materials in each pixel aperture 102 of the pixel defining layer 100, thereby forming pixel units 110. For example, the pixel units 110 usually comprise R, G, B sub-pixel units, that is, each pixel unit comprises three sub-pixel units.

The inventors have noted that due to the spatial distribution of the pixel apertures, solvents of inks in different pixel apertures have different volatilization rates, such that the thicknesses of the organic functional layers formed are not uniform once the inks are dried. A pixel unit comprising organic functional layers with non-uniform thicknesses will exhibit uneven luminescent performance and display performance. The solvent in the pixel unit located at the edge of the inkjet printing region (e.g., the pixel unit indicated by reference numeral 110 in FIG. 1A) has a faster drying rate than that of the pixel unit located in the inner region, such that the thicknesses of the films in the pixel unit located at the edge and the films in the pixel unit located in the inner region are different.

Therefore, embodiments of the present disclosure provide an improved pixel defining layer, a display panel, a display device, a method of fabricating a pixel defining layer, and a method of fabricating the display panel, which improves thickness uniformity of inkjet printed organic functional layers, and further improves the luminescent performance and display performance.

A pixel defining layer, a display panel, a display device, a method of fabricating a pixel defining layer, and a method of fabricating the display panel of the present disclosure will be illustrated hereinafter with reference to exemplary embodiments.

Figure 2:
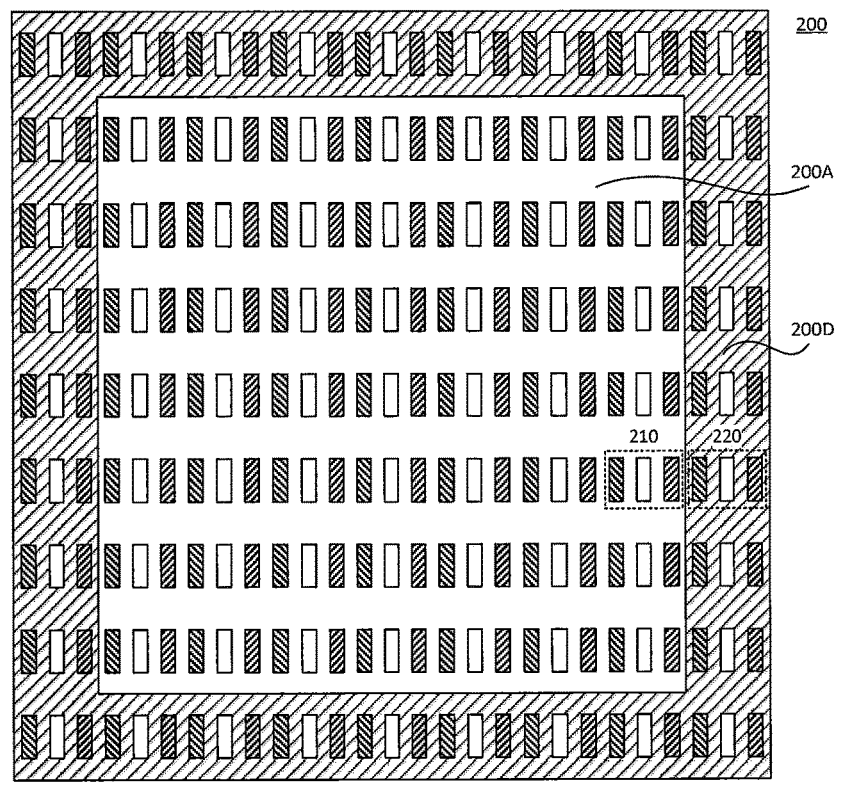
FIG. 2 is a schematic diagram of a pixel defining layer according to an embodiment of the present disclosure.

Embodiments of the present disclosure provide a pixel defining layer that can be used, for example, for a display panel of an organic electroluminescent display device (OLED). FIG. 2 shows a schematic plan view of a pixel defining layer in an embodiment of the present disclosure.

As shown in FIG. 2, a pixel defining layer 200 comprises a display area 200A and a non-display area 200D located at a periphery of the display area 200A. The display area 200A comprises pixel units 210 arranged in a matrix, and the non-display area 200D comprises dummy pixel units 220. The dummy pixel units are formed by inkjet printing in the pixel apertures of the dummy pixel units the same ink as the ink in the pixel apertures of the pixel units of the display area, but the dummy pixel units are not lit during operation of the OLED. By arranging the dummy pixel units at the periphery of the display area, the atmosphere around the pixel unit arranged near the edge in the display area can be changed, such that its solvent has a volatilization rate close to that of the solvent in the pixel unit near the inner side in the display area. This facilitates improving the thickness uniformity of the organic functional layers in the pixel units arranged near the edge in the display area, thereby achieving an OLED with uniform luminescent performance and display performance.

As shown in FIG. 2, the dummy pixel units 220 in the non-display area 200D are arranged in the same manner as the pixel units 210 in the display area 200A. That is, both the pixel units 210 and the dummy pixel units 220 are arranged for example in a matrix, and with the same period, pitch, and alternating manner.

The non-display area 200D comprises dummy pixel units 220 arranged outside one or more sides of the display area 200A. In the embodiment shown in FIG. 2, one dummy pixel unit 220 is arranged outside each pixel unit 210 located at the edge of the display area 200A.

Figure 3:
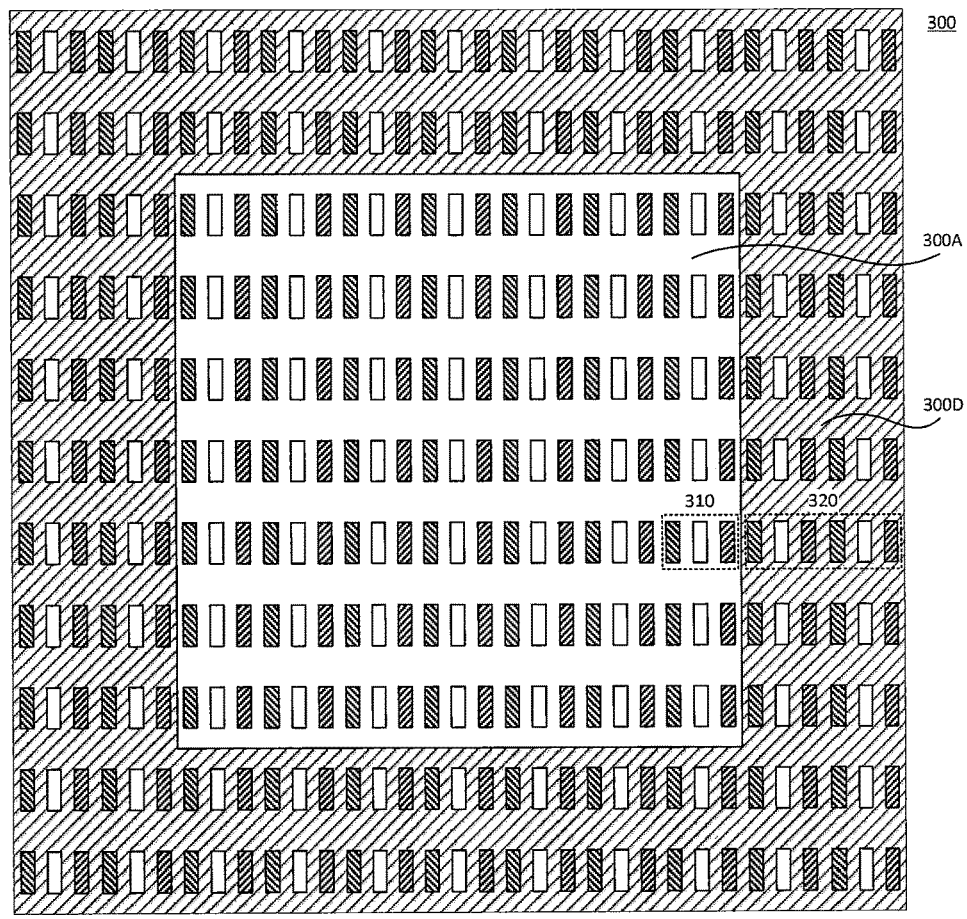
FIG. 3 is a schematic diagram of a pixel defining layer according to an embodiment of the present disclosure.

In an alternative embodiment, as shown in FIG. 3, a pixel defining layer 300 comprises a display area 300A and a non-display area 300D, and two dummy pixel units 320 are arranged outside each pixel unit 310 located at the edge of the display area 300A. It should be noted that in case the number of dummy pixel units arranged outside each pixel unit located at the edge of the display area is increased, the film uniformity of the organic functional layers in these pixel units located at the edge of the display area is increased. However, in actual design, it is also necessary to consider the width of the frame of the display panel, because when the number of dummy pixel units is increased, the width of the frame of the display panel increases, which is disadvantageous in achieving a narrow frame.

In the embodiments showed in FIG. 2 and FIG. 3, the non-display areas 200D, 300D comprise dummy pixel units 220, 320 arranged to enclose the display areas 200A, 300A. In these embodiments, the dummy pixel units are not only arranged outside the sides of the display area, but also outside the corners of the display area. This facilitates improving the film uniformity of the organic functional layers in the pixel units located at the corners of the display area, which will be described in more detail below.

Figure 4:
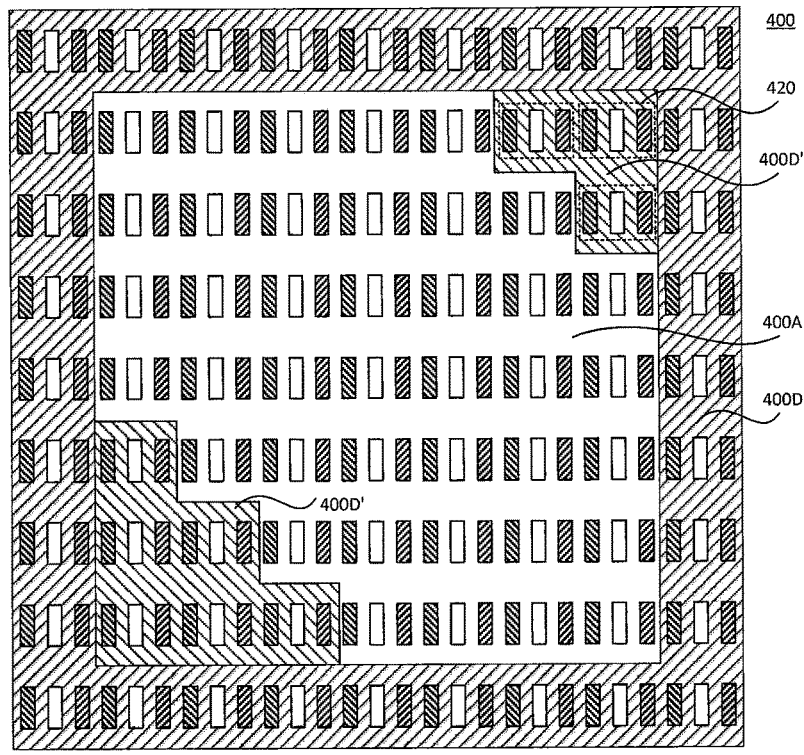
FIG. 4 is a schematic diagram of a pixel defining layer according to an embodiment of the present disclosure.

In an embodiment, as shown in FIG. 4, a pixel defining layer 400 comprises a display area 400A and a non-display area 400D'. Compared with the embodiment shown in FIG. 2, in the present embodiment, this is equivalent to that, a plurality of dummy pixel units 420 are arranged at one or more corners of the display area (i.e., the area indicated by 400D'). The inventors have found that, because the four corners of the display area are near the two edges, the volatilization rate of the solvent in the pixel units in these regions is higher than that of the pixel units in the inner side. This results in poor uniformity of thickness of the organic functional layers in the pixel units of the four corners and poor luminescent uniformity. Therefore, by arranging the pixel units in the four corners of the display area as the dummy pixel units (i.e., arranging the four corners of the original display area as non-display areas), these corners are not lit when the OLED is operated, thereby excluding luminescent anomalies that may occur at the four corners.

According to an embodiment of the present disclosure, at the four corners located at the original display area, the non-display areas 400D' comprise a plurality of dummy pixel units 420. In an embodiment, the dummy pixel units 420 in the non-display area 400D' are arranged in a delta shape. Each non-display area 400D' comprises, for example, $m*(m+1)/2$ dummy pixel units, where m is a natural number greater than or equal to 2. In an embodiment, each corner comprises three dummy pixel units 420 arranged in a delta shape, as shown in the non-display area 400D' in the upper right corner of FIG. 4. In another embodiment, each corner comprises six dummy pixel units 420 arranged in a delta shape, as shown in the non-display area 400D' in the lower left corner of FIG. 4. In the pixel defining layer 400 of this embodiment, the display area 400A has a rounded rectangular shape, i.e., the pixel units at each corner of the display area 400A are arranged in a rounded corner. The dummy pixel units 420 in the non-display area 400D' and the adjacent pixel units in the display area 400A form a right-angled shape. In other words, the display area of the rounded rectangular shape and the non-display areas at each corner of the display area form a right-angled rectangular shape.

Similar to the embodiment shown in FIG. 2, the pixel defining layer 400 also comprises a non-display area 400D located at the periphery of the display area 400A. The description about the non-display area 200D and its dummy pixel units presented with reference to FIG. 2 is also applicable to the non-display area 400D and its dummy pixel units shown in FIG. 4, which will not be repeated herein for simplicity.

Figure 5:
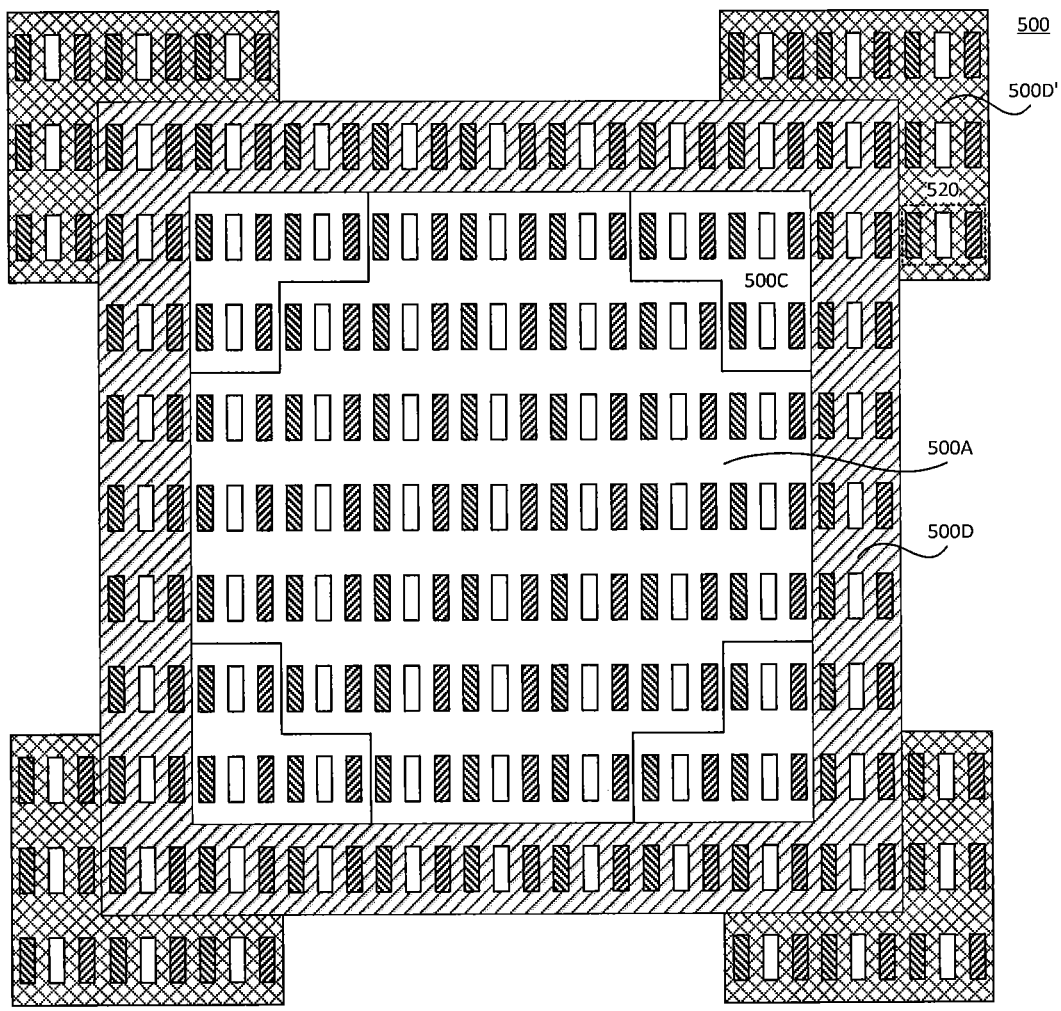
FIG. 5 is a schematic diagram of a pixel defining layer according to an embodiment of the present disclosure.

In an embodiment, as shown in FIG. 5, a pixel defining layer 500 comprises a display area 500A and a non-display area 500D'. The non-display area 500D' is located outside one or more corners 500C of the display area 500A, and comprises a plurality of dummy pixel units 520. Each non-display area 500D' comprises, for example, 2n+1 dummy pixel units arranged in an L shape, where n is a natural number greater than or equal to 2. In the embodiment shown in FIG. 5, the non-display area 500D' outside each corner 500C comprises five dummy pixel units 520 which are arranged in an L shape. By arranging the non-display area 500D' comprising the plurality of dummy pixel units 520 outside the corner 500C, the thickness uniformity of the organic functional layers in the pixel units located at the corner 500C is improved, and the luminescent uniformity is improved. This facilitates achieving uniform film thickness of the organic functional layer and uniform luminescent performance over the entire display area 500A.

Optionally, the pixel defining layer 500 comprises a non-display area 500D located at the periphery of the display area 500A. The description about the non-display area 200D and its dummy pixel units presented with reference to FIG. 2 is also applicable to the non-display area 500D and its dummy pixel units shown in FIG. 5, which will not be repeated herein for simplicity.

In the case shown in FIG. 5, the non-display area 500D' is arranged next to the outside of the corner of the non-display area 500D. However, when the pixel defining layer 500 does not comprise the optional non-display area 500D as described above, the non-display area 500D' is arranged next to the outside of the corner 500C of the display area 500A.

Figure 6:
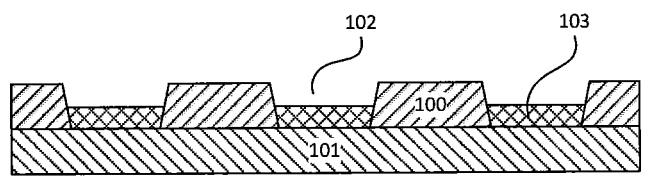
FIG. 6 is a schematic cross-sectional view of a display panel according to an embodiment of the present disclosure.

Embodiments of the present disclosure further provide a display panel that can be used, for example, for an organic electroluminescence display device (OLED). FIG. 6 shows a schematic cross-sectional view of a display panel provided by an embodiment of the present disclosure.

As shown in FIG. 6, the display panel comprises a substrate 101, and a pixel defining layer 100 arranged on the substrate 101. The pixel defining layer 100 can be a pixel defining layer as described in any of the preceding embodiments. As shown, the pixel defining layer 100 comprises a plurality of pixel apertures 102. Each pixel aperture 102 corresponds to a pixel unit and a dummy pixel unit, respectively.

In this embodiment, the display panel is, for example, an OLED display panel. The organic functional layers 103 of the display panel are formed, for example, by inkjet printing an organic material in each pixel aperture 102 of the pixel defining layer 100. Since the pixel defining layer 100 comprises the dummy pixel units arranged in the foregoing manner, the thickness uniformity of the organic functional layers in the pixel units of the different regions of the display panel is improved, and thus the uniformity of display performance of the display panel is improved.

In one or more embodiments, the organic functional layer 103 is, for example, an electron injection layer, an electron transport layer, an organic light emitting layer, a hole transport layer, and a hole injection layer, etc. It should be noted that the display panel of course also comprises functional films and functional structures such as electrodes, drive circuits, etc.

Embodiments of the present disclosure further provide a display device comprising the above-described display panel. The display device is any product or component having a display function, such as a mobile phone, a tablet computer, a computer display, a game machine, a television, a display screen, a wearable device, a digital photo frame, a navigator, etc.

Embodiments of the present disclosure further provide a method of fabricating a pixel defining layer, comprising: step S10, applying a pixel defining material on a substrate; and step S12, forming pixel units in a display area of the substrate, and forming dummy pixel units in the non-display area of the substrate.

Embodiments of the present disclosure further provides a method of fabricating a display panel, comprising: step S20, forming a pixel defining layer as described in the foregoing example, and step S30, inkjet printing an organic material in the pixel defining layer to form an organic functional layer.

It should be noted that the above-described display panel, display device, method of fabricating the pixel defining layer, and method of fabricating the display panel have the same or similar embodiments as the pixel defining layer described above, and accordingly have the same or similar beneficial effects, which will not be repeated herein for simplicity.

Embodiments of the present disclosure disclose a pixel defining layer, a display panel, a display device, a method of fabricating a pixel defining layer, and a method of fabricating the display panel. The pixel defining layer comprises a display area and a non-display area located at a periphery of the display area, wherein the display area comprises pixel units arranged in a matrix, and the non-display area comprises dummy pixel units. By arranging the dummy pixel unit at the periphery of the display area, the atmosphere around the pixel unit arranged near the edge in the display area can be changed, such that the volatilization rate of its solvent is close to the volatilization rate of the solvent in the pixel unit arranged near the inner side in the display area. This facilitates improving the thickness uniformity of the organic functional layers in the pixel units arranged near the edge in the display area, thereby achieving an display device with uniform luminescent performance and display performance.

The above description is only implementation of this disclosure. But the protection scope of the present disclosure is not limited to this. Any changes or substitutions that may be easily conceived by one of ordinary skill in the art within the technical scope disclosed by the present disclosure should be covered within the protection scope of the present disclosure. Therefore, the protection scope of the present disclosure should be subject to the protection scope of the claims.

What is claimed is:

1. A pixel defining layer, comprising: a rectangular display area; and a non-display area at a periphery of the rectangular display area, wherein a width of the non-display area at a corner of the non-display area is wider than a width of the non-display area at middle of an edge of the non-display area, wherein the non-display area comprises a first rectangular non-display area surrounding the rectangular display area and a plurality of second L-shaped non-display areas located outside corners of the first rectangular non-display area, the plurality of second L-shaped non-display areas are spaced apart from each other; wherein the display area comprises a plurality of pixel units, wherein the non-display area comprises a plurality of dummy pixel units, a quantity of the dummy pixel units in a width direction at the corner of the non-display area is greater than a quantity of the dummy pixel units in a width direction at the middle of the edge of the non-display area, and wherein the pixel units in each of one or more corners of the display area are arranged such that the pixel units have a rounded external contour, and the dummy pixel units are arranged such that the dummy pixel units have a right-angled external contour.

2. The pixel defining layer according to claim 1, wherein the plurality of dummy pixel units are arranged in a delta shape.

3. The pixel defining layer according to claim 2, wherein m*(m+1)/2 dummy pixel units are arranged outside each corner of the one or more corners of the display area,
wherein m is a natural number greater than or equal to 2.

4. The pixel defining layer according to claim 2, wherein three dummy pixel units of the plurality of dummy pixel units are arranged outside each corner of the one or more corners of the display area.

5. A pixel defining layer, comprising:
a rectangular display area; and
a non-display area at a periphery of the rectangular display area,
wherein the non-display area comprises a first rectangular non-display area surrounding the rectangular display area and a plurality of second L-shaped non-display areas located outside corners of the first rectangular non-display area, the plurality of second L-shaped non-display areas are spaced apart from each other,
wherein the rectangular display area comprises a plurality of pixel units,
wherein the first rectangular non-display area comprises a plurality of first dummy pixel units which are arranged outside the first rectangular display area and in a rectangular frame,
wherein each of the plurality of second L-shaped non-display areas comprises two branches perpendicular to each other, the two branches comprise a plurality of second dummy pixel units arranged in an L-shape, and the second dummy pixel units of each of the two branches is spaced apart from the second dummy pixel units of a neighboring branch of an adjacent one of the plurality of second L-shaped non-display areas, and
wherein none of the pixel units, the first dummy pixel units and the second dummy pixel units exists in an interval between the second dummy pixel units of said each of the two branches and the second dummy pixel units of said neighboring branch of the adjacent one of the plurality of second L-shaped non-display areas.

6. The pixel defining layer according to claim 5, wherein five second dummy pixel units of the plurality of second dummy pixel units are arranged outside each corner of the first rectangular non-display.

7. The pixel defining layer according to claim 1, wherein the plurality of dummy pixel units comprise a plurality of first dummy pixel units, and wherein the non-display area further comprises:
a plurality of second dummy pixel units arranged outside one or more sides of the display area.

8. A display panel, comprising:
a substrate; and
the pixel defining layer according to claim 1, which is arranged on the substrate.

9. A display device, comprising the display panel according to claim 8.

10. A method of fabricating a pixel defining layer, comprising:
applying a pixel defining material on a substrate;
forming pixel units in a rectangular display area of the substrate;
forming a plurality of first dummy pixel units in a first rectangular non-display area of the substrate surrounding the rectangular display area, the a plurality of first dummy pixel units being arranged in a rectangular frame; and
forming a plurality of second dummy pixel units in a plurality of second L-shaped non-display areas outside corners of the first rectangular non-display area, the plurality of second L-shaped non-display areas being spaced apart from each other,
wherein each of the plurality of second L-shaped non-display areas comprises two branches perpendicular to each other, the two branches comprise second dummy pixel units arranged in an L-shape, and the second dummy pixel units of each of the two branches is spaced apart from the second dummy pixel units of a neighboring branch of an adjacent one of the plurality of second L-shaped non-display areas, and
wherein none of the pixel units, the first dummy pixel units and the second dummy pixel units exists in an interval between the second dummy pixel units of said each of the two branches and the second dummy pixel units of said neighboring branch of the adjacent one of the plurality of second L-shaped non-display areas.

11. A method of fabricating a display panel, comprising:
forming the pixel defining layer of claim 1, and
inkjet printing an organic material in the pixel defining layer to form an organic functional layer.

12. A display panel, comprising:
a substrate; and
the pixel defining layer according to claim 5,
wherein the pixel defining layer is arranged on the substrate.

13. A method of fabricating a display panel, comprising:
forming the pixel defining layer of claim 5, and
inkjet printing an organic material in the pixel defining layer to form an organic functional layer.

* * * * *